(12) United States Patent
Chidambarrao et al.

(10) Patent No.: US 7,928,571 B2
(45) Date of Patent: Apr. 19, 2011

(54) DEVICE HAVING DUAL ETCH STOP LINER AND REFORMED SILICIDE LAYER AND RELATED METHODS

(75) Inventors: Dureseti Chidambarrao, Weston, CT (US); Ying Li, Newburgh, NY (US); Rajeev Malik, Pleasantville, NY (US); Shreesh Narasimha, Beacon, NY (US)

(73) Assignee: International Business Machines Corporation, Armonk, NY (US)

( * ) Notice: Subject to any disclaimer, the term of this patent is extended or adjusted under 35 U.S.C. 154(b) by 402 days.

(21) Appl. No.: 11/850,968

(22) Filed: Sep. 6, 2007

(65) Prior Publication Data

US 2007/0296044 A1    Dec. 27, 2007

Related U.S. Application Data

(62) Division of application No. 10/905,027, filed on Dec. 10, 2004, now Pat. No. 7,446,062.

(51) Int. Cl.
| | |
|---|---|
| *H01L 27/088* | (2006.01) |
| *H01L 29/40* | (2006.01) |
| *H01L 23/48* | (2006.01) |
| *H01L 23/52* | (2006.01) |
| *H01L 23/62* | (2006.01) |

(52) U.S. Cl. .................... 257/754; 257/384; 257/768
(58) Field of Classification Search .................... None
See application file for complete search history.

(56) References Cited

U.S. PATENT DOCUMENTS

| | | | |
|---|---|---|---|
| 4,316,209 A | 2/1982 | Ho et al. | |
| 5,972,785 A * | 10/1999 | Shishiguchi et al. | 438/592 |
| 6,140,232 A | 10/2000 | Lin et al. | |
| 7,052,946 B2 | 5/2006 | Chen et al. | |
| 2006/0121665 A1 * | 6/2006 | Fang et al. | 438/199 |

OTHER PUBLICATIONS

Chidambarrao et al., U.S. Appl. No. 10/905,027, filed Dec. 10, 2004, Office Action Summary, Dec. 4, 2006. 9 pages.
Chidambarrao et al., U.S. Appl. No. 10/905,027, filed Dec. 10, 2004, Office Action Summary, Jun. 5, 2007, 8 pages.
Chidambarrao et al., U.S. Appl. No. 10/905,027, filed Dec. 10, 2004, Office Action Summary, Jan. 30, 2008, 8 pages.
Chidambarrao et al., U.S. Appl. No. 10/905,027, filed Dec. 10, 2004, Notice of Allowance and Fee(s) Due, Jun. 30, 2008, 7 pages.

* cited by examiner

*Primary Examiner* — Zandra Smith
*Assistant Examiner* — Pamela E Perkins
(74) *Attorney, Agent, or Firm* — Dani Schnurmann; Hoffman Warnick LLC

(57) ABSTRACT

The present invention provides a semiconductor device having dual silicon nitride liners and a reformed silicide layer and related methods for the manufacture of such a device. The reformed silicide layer has a thickness and resistance substantially similar to a silicide layer not exposed to the formation of the dual silicon nitride liners. A first aspect of the invention provides a method for use in the manufacture of a semiconductor device comprising the steps of applying a first silicon nitride liner to a silicide layer, removing a portion of the first silicon nitride liner, reforming a portion of the silicide layer removed during the removal step, and applying a second silicon nitride liner to the silicide layer.

11 Claims, 4 Drawing Sheets

US 7,928,571 B2

DEVICE HAVING DUAL ETCH STOP LINER AND REFORMED SILICIDE LAYER AND RELATED METHODS

REFERENCE TO PRIOR APPLICATIONS

This application is a Divisional Application of co-pending U.S. patent application Ser. No. 10/905,027, filed on Dec. 10, 2004, which is hereby incorporated by reference.

BACKGROUND OF THE INVENTION (1) Technical Field

The present invention relates generally to semiconductor devices and more particularly to an NFET/PFET device having dual etch stop liners and silicide layers of normal thickness and resistance.

(2) Related Art

The application of stresses to field effect transistors (FETs) is known to improve their performance. When applied in a longitudinal direction (i.e., in the direction of current flow), tensile stress is known to enhance electron mobility (or n-channel FET (NFET) drive currents) while compressive stress is known to enhance hole mobility (or p-channel FET (PFET) drive currents).

One way to apply such stresses to a FET is the use of intrinsically-stressed barrier silicon nitride liners. For example, a tensile-stressed silicon nitride liner may be used to cause tension in an NFET channel while a compressively-stressed silicon nitride liner may be used to cause compression in a PFET channel. Accordingly, a dual/hybrid liner scheme is necessary to induce the desired stresses in an adjacent NFET and PFET.

In the formation of a dual/hybrid barrier silicon nitride liners for stress enhancement of NFET/PFET devices, the first deposited liner must be removed in one of the two FET regions by patterning and etching. For example, FIG. 1 shows a typical device 100 comprising a buried silicon dioxide (BOX) 110, a shallow trench isolation (STI) 120, an NFET 140, a spacer 142, a PFET 150, a spacer 152, and a silicide layer 130a-d. Silicide layer 130a-d may be any material known in the art, including, for example, cobalt silicide ($CoSi_2$), titanium silicide ($TiSi_2$), molybdenum silicide ($MoSi_2$), tungsten silicide ($WSi_2$), nickel silicide ($Ni_xSi_y$), and tantalum silicide ($TaSi_2$).

FIG. 2 shows the deposition of a first silicon nitride liner 160 onto device 100. In this case, first silicon nitride liner 160 is a tensile silicon nitride, although other silicon nitrides may be used, including, for example, a compressive silicon nitride. In order to form a dual/hybrid liner, a portion of first silicon nitride liner 160 must be removed from one of the FET regions. In order to ensure sufficient contact of a second deposited liner, it is preferable that first silicon nitride liner 160 be completely removed from the chosen FET region. However, complete removal of first silicon nitride liner 160 requires an overetch, necessarily resulting in some etching of underlying silicide layer 130a-d.

Referring to FIG. 3, the masking of NFET 140 and etching of tensile silicon nitride liner 160 adjacent PFET 150 results in an etched silicide layer 132a-b adjacent PFET 150. Etching may be by any means known in the art, including, for example, anisotropic reactive ion etching (RIE).

In methods currently known in the art, a second silicon nitride liner is deposited onto device 100 after etching, resulting in silicide layers of different thicknesses adjacent NFET 140 and PFET 150. In addition to a difference in thickness, etched silicide layer 132a-b exhibits increased silicide resistance ($R_s$) relative to silicide layer 130a-b.

Silicide layer 130a-b normally has a thickness between about 15 nm and about 50 nm, with a corresponding $R_S$ between about 6 ohm/sq and about 20 ohm/sq. By comparison, etched silicide layer 132a-b may have a thickness between about 5 nm and about 40 nm, with a corresponding $R_S$ between about 12 ohm/sq and about 40 ohm/sq.

Particularly in technologies beyond 90 nm, which utilize very ultra small gatelengths (e.g., <35 nm) and diffusion widths (e.g., <100 nm), such an increase in $R_s$ is unacceptable for at least two reasons. First, the increases in $R_s$ will impact performance of the device. Second, erosion of the silicide layer during the overetch increases the chance of failure by the polysilicon conductor (PC)-opens mechanism (i.e., the silicide on top of the PC is eroded or absent).

Accordingly, a need exists for a semiconductor device having dual etch stop liners and silicide layers of normal thickness and resistance and methods for the manufacture of such a device.

SUMMARY OF THE INVENTION

The present invention provides a semiconductor device having dual silicon nitride liners and a reformed silicide layer and related methods for the manufacture of such a device. The reformed silicide layer has a thickness and resistance substantially similar to a silicide layer not exposed to the formation of the dual silicon nitride liners. A first aspect of the invention provides a method for use in the manufacture of a semiconductor device comprising the steps of applying a first silicon nitride liner to a silicide layer, removing a portion of the first silicon nitride liner, reforming a portion of the silicide layer removed during the removal step, and applying a second silicon nitride liner to the silicide layer.

A second aspect of the invention provides a method for use in the manufacture of a semiconductor device having an NFET and a PFET, comprising the steps of applying a first silicon nitride liner to the NFET, PFET, and a silicide layer adjacent at least one of the NFET and the PFET, removing a portion of the first silicon nitride liner adjacent one of the NFET and the PFET, reforming a portion of the silicide layer removed during the removal step, and applying a second silicon nitride liner to the reformed silicide layer and the one of the NFET and the PFET.

A third aspect of the invention provides a method of reforming a portion of a silicide layer, comprising the steps of applying a metal layer to a remaining portion of an etched silicide layer, and forming a silicide with the metal layer and the remaining portion of the silicide layer.

A fourth aspect of the invention provides a semiconductor device, comprising a first silicon nitride liner, a second silicon nitride liner, and a partially reformed silicide layer, wherein a portion of the silicide layer is formed by the resilicidation of a deposited metal.

The foregoing and other features of the invention will be apparent from the following more particular description of embodiments of the invention.

BRIEF DESCRIPTION OF THE DRAWINGS

The embodiments of this invention will be described in detail, with reference to the following figures, wherein like designations denote like elements, and wherein.

DETAILED DESCRIPTION OF THE INVENTION

Figure 1:
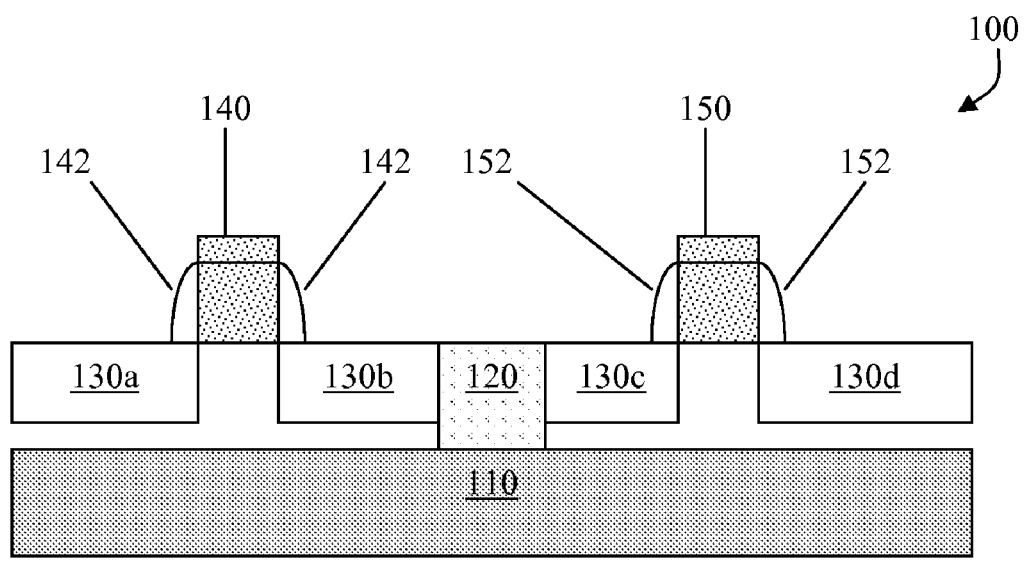
FIG. 1 shows a prior art device including an NFET/PFET.
Figure 2:
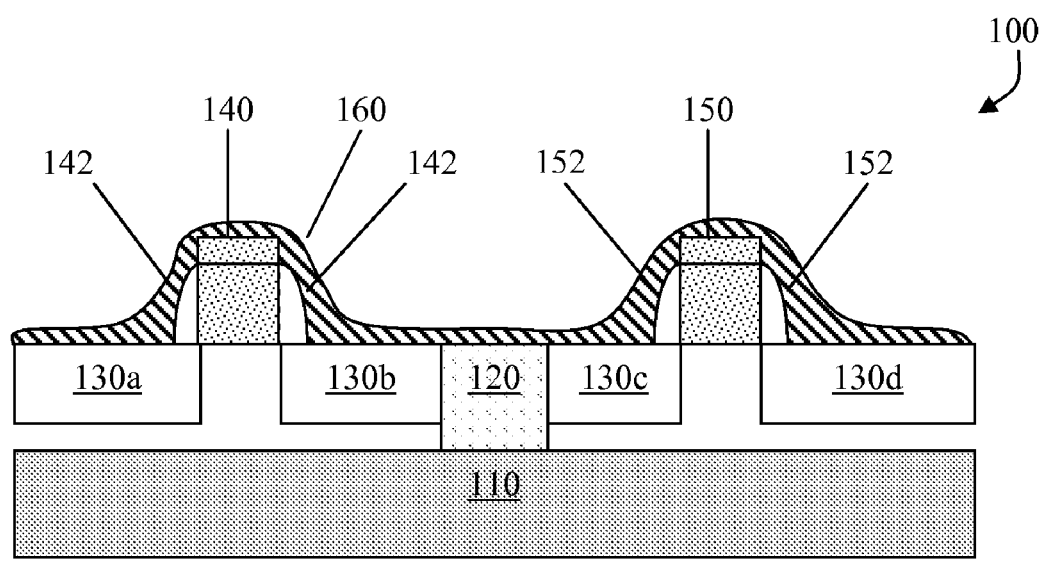
FIG. 2 shows deposition of a first silicon nitride liner to the prior art device of FIG. 1.
Figure 3:
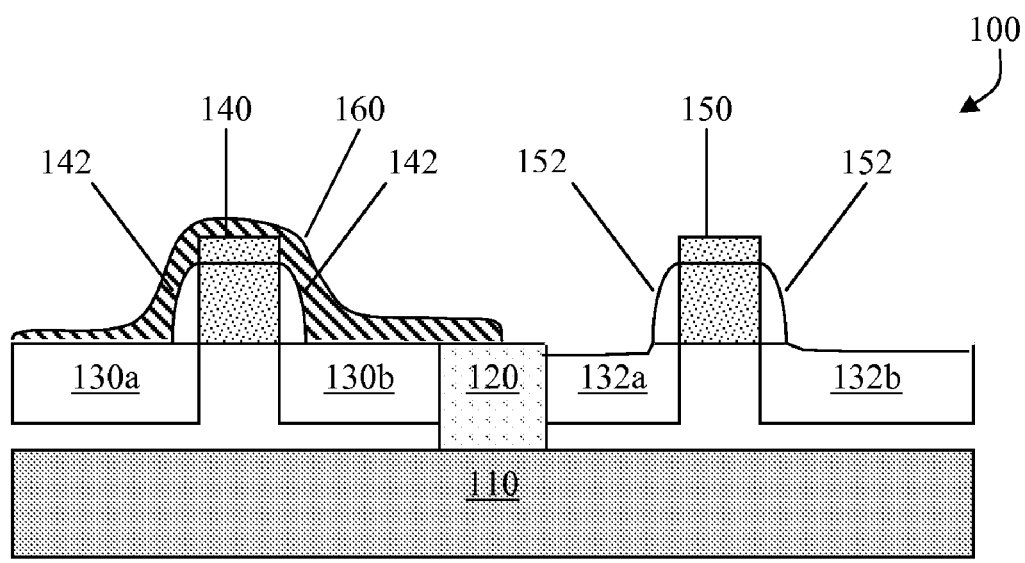
FIG. 3 shows damage to a silicide layer after etching the first silicon nitride liner from a portion of the prior art device of FIG. 2.
Figure 4:
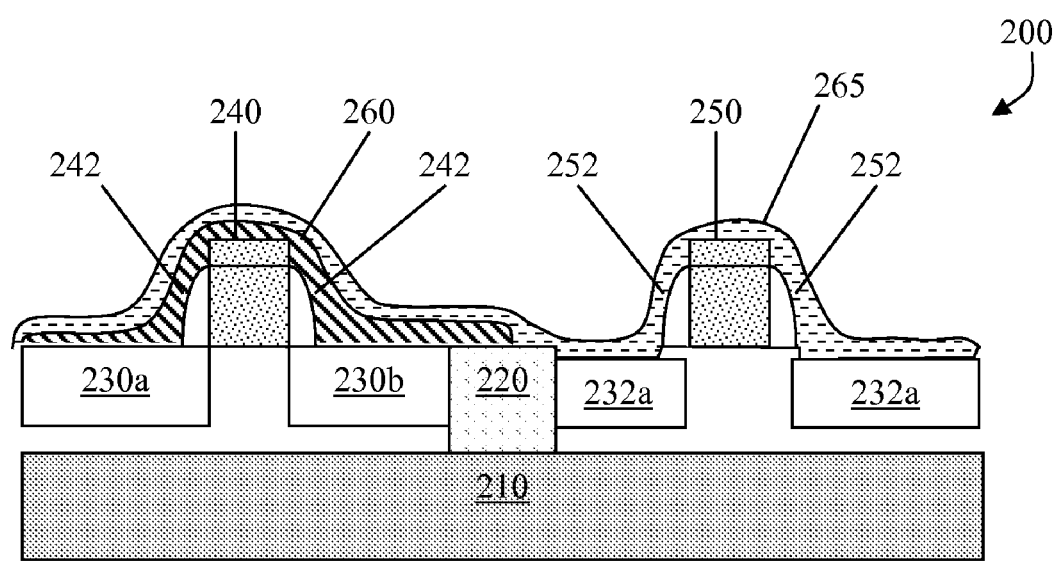
FIG. 4 shows deposition of a metal layer to the device of FIG. 3.

Referring to FIG. 4, after processing in a manner substantially the same as that shown in the steps of FIGS. 1-3, a metal layer 265 is applied to device 200. Metal layer 265 includes a metal present in the metal-silicon alloy of silicide layer 230a-b, 232a-b. For example, where silicide layer 230a-b, 232a-b is cobalt silicide ($CoSi_2$), metal layer 165 includes cobalt (Co).

Figure 5:
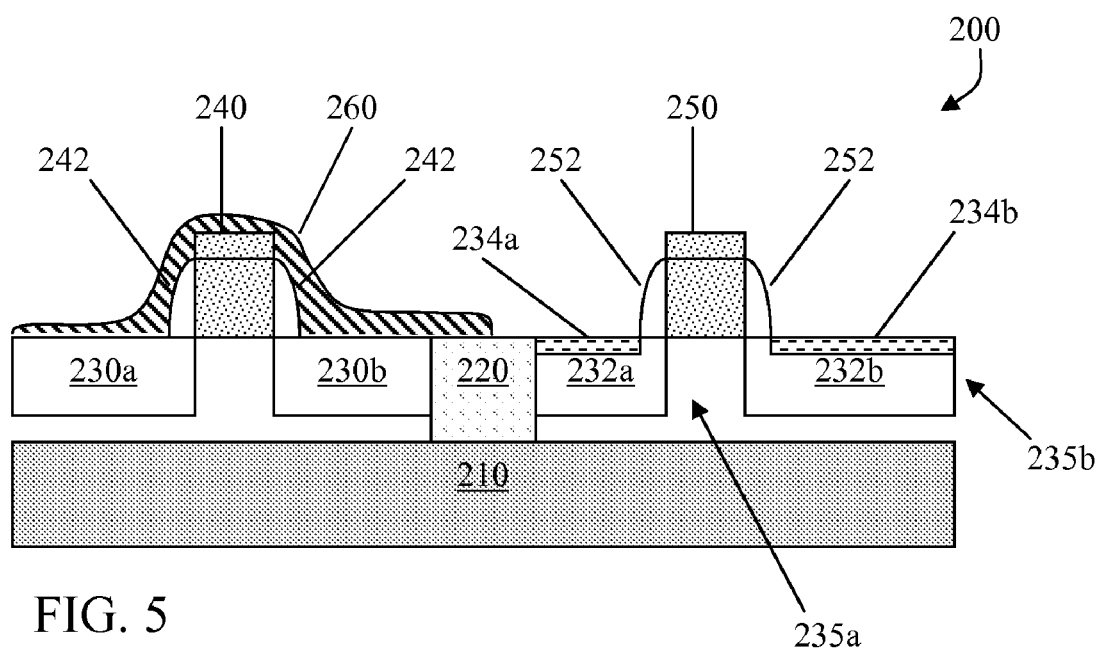
FIG. 5 shows a reformed silicide layer following silicidation of the metal layer in FIG. 4.

In FIG. 5, a reformed silicide layer 234a-b is formed on the surface of etched silicide layer 232a-b by a sintering process and any unsilicidated metal layer is removed. Together, etched silicide layer 232a-b and reformed silicide layer 234a-b make up resilicided layer 235a-b, having substantially the same thickness and resistance as silicide layer 230a-b. Alternatively, resilicided layer 235a-b may be thicker than silicide layer 230a-b, with a corresponding decrease in $R_s$. Thus, the device and methods of the present invention avoid both the physical thinning of the silicide layer and the resulting increase in silicide resistance.

Figure 6:
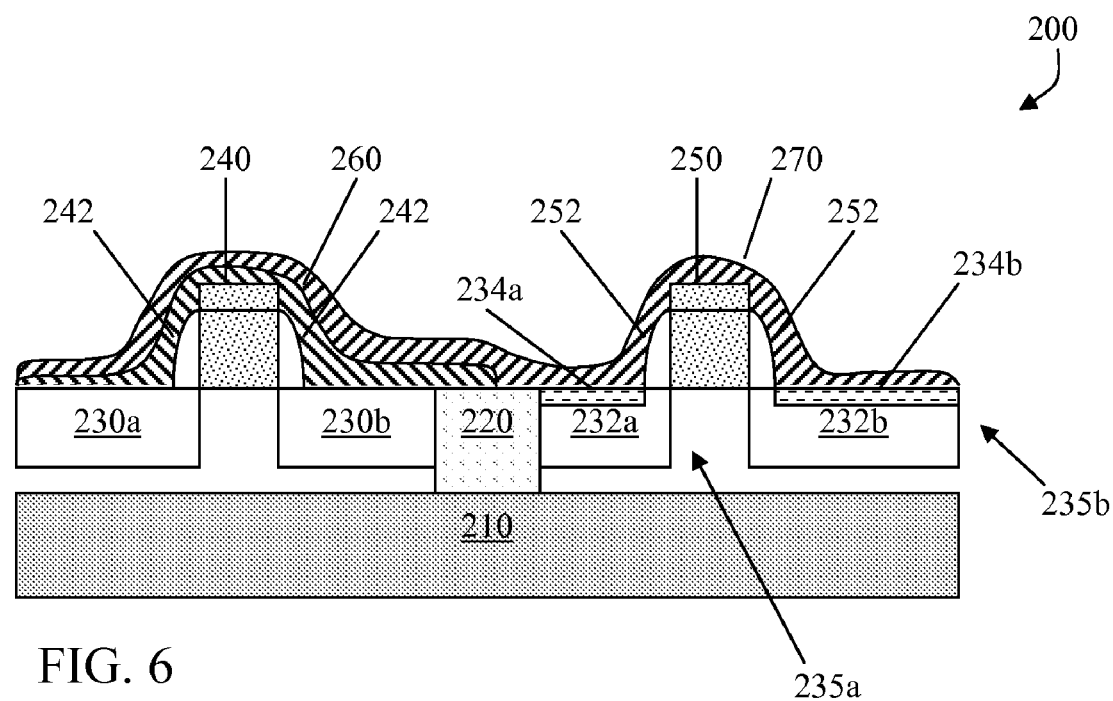
FIG. 6 shows deposition of a second silicon nitride liner to the device of FIG. 5.

Referring now to FIG. 6, a compressive nitride liner 270 is applied to device 200. Suitable silicon nitride liners may be formed by plasma enhanced chemical vapor deposition (PECVD), rapid thermal chemical vapor deposition (RTCVD), or low pressure chemical vapor deposition (LPCVD). Formation by any of these methods is generally done at a temperature between about 400° C. and about 750° C.

Figure 7:
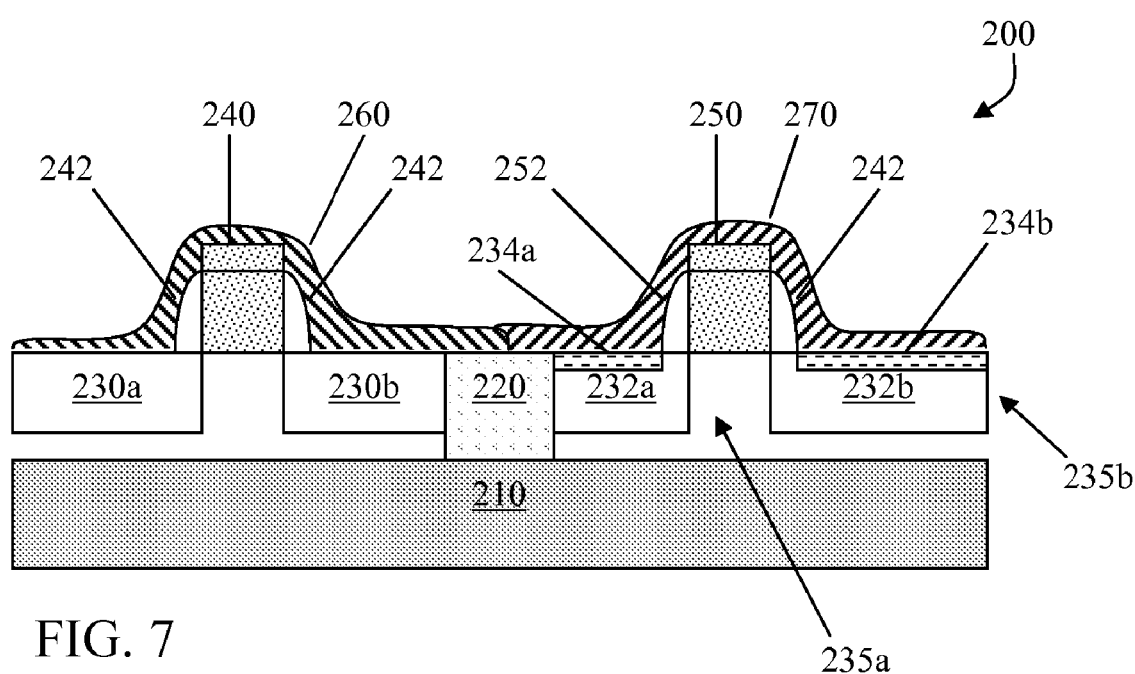
FIG. 7 shows a finished device according to the invention.

Finally, in FIG. 7, compressive silicon nitride liner 270 has been masked in an area adjacent PFET 250 and etched in an area adjacent tensile silicon nitride liner 260, forming the finished device 200 of the invention. Device 200 of FIG. 7 has a hybrid/dual etch stop liner 260, 270 and a resilicided layer 235a-b including etched silicide layer 232a-b and reformed silicide layer 234a-b. Thus, device 200 provides a hybrid/dual etch stop liner 260, 270 without the increased silicide resistance associated with methods and devices known in the art.

While formation of device 200 has been described as involving the deposition of a tensile silicon nitride liner 260 and the later deposition of a compressive silicon nitride liner 270, it should be appreciated that the order of deposition of these liners may be reversed. That is, it is also within the scope of the present invention to form device 200 by the first deposition of a compressive silicon nitride liner 270, etching of compressive silicon nitride liner 270 from an area around NFET 240, resilicidation of etched silicide layer 232a-b (this time adjacent NFET 240 rather than PFET 250), deposition of a tensile silicon nitride liner 260, and patterning and etching of tensile silicon nitride liner 260 from an area around PFET 250.

While this invention has been described in conjunction with the specific embodiments outlined above, it is evident that many alternatives, modifications and variations will be apparent to those skilled in the art. Accordingly, the embodiments of the invention as set forth above are intended to be illustrative, not limiting. Various changes may be made without departing from the spirit and scope of the invention as defined in the following claims.

What is claimed is:

1. A semiconductor device, comprising:
   a first silicon nitride liner;
   a second silicon nitride liner;
   a silicide layer; and
   a partially reformed silicide layer having a resilicided deposited metal and wherein at least one of a thickness and a resistance of the partially reformed silicide layer is substantially the same as the silicide layer.

2. The device of claim 1, wherein at least one of the first and second silicon nitride liners is formed by at least one of plasma enhanced chemical vapor deposition, rapid thermal chemical vapor deposition, and low pressure chemical vapor deposition.

3. The device of claim 1, wherein the first silicon nitride liner is a tensile silicon nitride liner.

4. The device of claim 1, wherein the second silicon nitride liner is a compressive silicon nitride liner.

5. The device of claim 1, wherein the first silicon nitride liner substantially covers a first device and the second silicon nitride liner substantially covers a second device.

6. The device of claim 5, wherein the first device is an NFET and the second device is a PFET.

7. The device of claim 6, wherein the first silicon nitride liner is a tensile silicon nitride liner and the second silicon nitride liner is a compressive silicon nitride liner.

8. The device of claim 7, wherein at least one of the first silicon nitride liner and the second silicon nitride liner provides a stress to at least one of the NFET and the PFET.

9. The device of claim 8, wherein the stress improves at least one of electron mobility and hole mobility compared to an NFET and a PFET not substantially covered by a tensile silicon nitride liner and a compressive silicon nitride liner, respectively.

10. The device of claim 1, wherein at least one of the first silicon nitride liner and the second silicon nitride liner is selected from a group consisting of: cobalt silicide ($CoSi_2$), titanium silicide ($TiSi_2$), molybdenum silicide ($MoSi_2$), tungsten silicide ($WSi_2$), nickel silicide ($Ni_xSi_y$), and tantalum silicide ($TaSi_2$).

11. The device of claim 1, wherein the metal includes at least one of cobalt, titanium, molybdenum, tungsten, tantalum, nickel, and platinum.

* * * * *